US012676585B2

(12) United States Patent
Nishimura et al.

(10) Patent No.: US 12,676,585 B2
(45) Date of Patent: Jul. 7, 2026

(54) PIEZOELECTRIC VIBRATOR, PIEZOELECTRIC OSCILLATOR, AND PIEZOELECTRIC VIBRATOR MANUFACTURING METHOD HAVING ELECTRODES WITH DIFFERENT THICKNESSES

(71) Applicant: Murata Manufacturing Co., Ltd., Nagaokakyo (JP)

(72) Inventors: Toshio Nishimura, Nagaokakyo (JP); Yuuki Ooi, Nagaokakyo (JP); Tadashi Yoda, Nagaokakyo (JP); Tadayuki Okawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 718 days.

(21) Appl. No.: 18/133,347

(22) Filed: Apr. 11, 2023

(65) Prior Publication Data

US 2023/0246625 A1     Aug. 3, 2023

Related U.S. Application Data

(63) Continuation of application No. PCT/JP2021/025550, filed on Jul. 7, 2021.

(30) Foreign Application Priority Data

Dec. 11, 2020     (JP) ................................ 2020-205988

(51) Int. Cl.
*H03H 9/02* (2006.01)
*H03H 3/02* (2006.01)
(Continued)

(52) U.S. Cl.
CPC .......... *H03H 9/02094* (2013.01); *H03H 3/02* (2013.01); *H03H 9/02102* (2013.01);
(Continued)

(58) Field of Classification Search
CPC ........... H03H 9/02094; H03H 9/02102; H03H 9/02118; H03H 9/02133; H03H 9/1021;
(Continued)

(56) References Cited

U.S. PATENT DOCUMENTS 11,063,574 B2 *  7/2021  Takahashi ............ H03H 9/0509
2004/0140865 A1   7/2004  Komuro et al.
(Continued)

FOREIGN PATENT DOCUMENTS

JP        H05275401 A      10/1993
JP        2004120494 A      4/2004
(Continued)

OTHER PUBLICATIONS

International Search Report in PCT/JP2021/025550, mailed Sep. 28, 2021, 4 pages.

*Primary Examiner* — Emily P Pham
(74) *Attorney, Agent, or Firm* — ArentFox Schiff LLP

(57) ABSTRACT

A quartz crystal resonator unit that includes: a piezoelectric blank; a first excitation electrode on a first principal surface and within at least a part of a vibration portion of the piezoelectric blank; a second excitation electrode on a second principal surface and within at least a part of the vibration portion of the piezoelectric blank; a first extended electrode on the first principal surface and electrically connected to the first excitation electrode; and a second extended electrode on the second principal surface and electrically connected to the second excitation electrode; and an insulation layer including a hollow portion which defines a space with the second excitation electrode. A thickness of the first extended electrode is larger than a thickness of the second extended electrode. An end portion of the first extended electrode extends over the hollow portion in a plan view of the piezoelectric vibrator.

20 Claims, 12 Drawing Sheets

1

(51) Int. Cl.
   *H03H 9/10*        (2006.01)
   *H03H 9/19*        (2006.01)

(52) U.S. Cl.
   CPC .... *H03H 9/02118* (2013.01); *H03H 9/02133*
       (2013.01); *H03H 9/1021* (2013.01); *H03H*
       *9/19* (2013.01); *H03H 2003/022* (2013.01)

(58) Field of Classification Search
   CPC ...... H03H 9/19; H03H 9/0542; H03H 9/1014;
       H03H 9/02; H03H 3/02; H03H 2003/022
   See application file for complete search history.

(56)                References Cited

U.S. PATENT DOCUMENTS

| | | |
|---|---|---|
| 2012/0280598 A1 | 11/2012 | Mizusawa |
| 2014/0103778 A1 | 4/2014 | Inaba et al. |
| 2014/0145553 A1 | 5/2014 | Kihara et al. |
| 2014/0361664 A1 | 12/2014 | Taniguchi et al. |

FOREIGN PATENT DOCUMENTS

| | | |
|---|---|---|
| JP | 2012175405 A | 9/2012 |
| JP | 2012235365 A | 11/2012 |
| JP | 2014078905 A | 5/2014 |
| JP | 2014107711 A | 6/2014 |
| JP | 2014239392 A | 12/2014 |
| JP | 2016152478 A | 8/2016 |
| JP | 2019193168 A | 10/2019 |
| JP | 2020053802 A | 4/2020 |

* cited by examiner

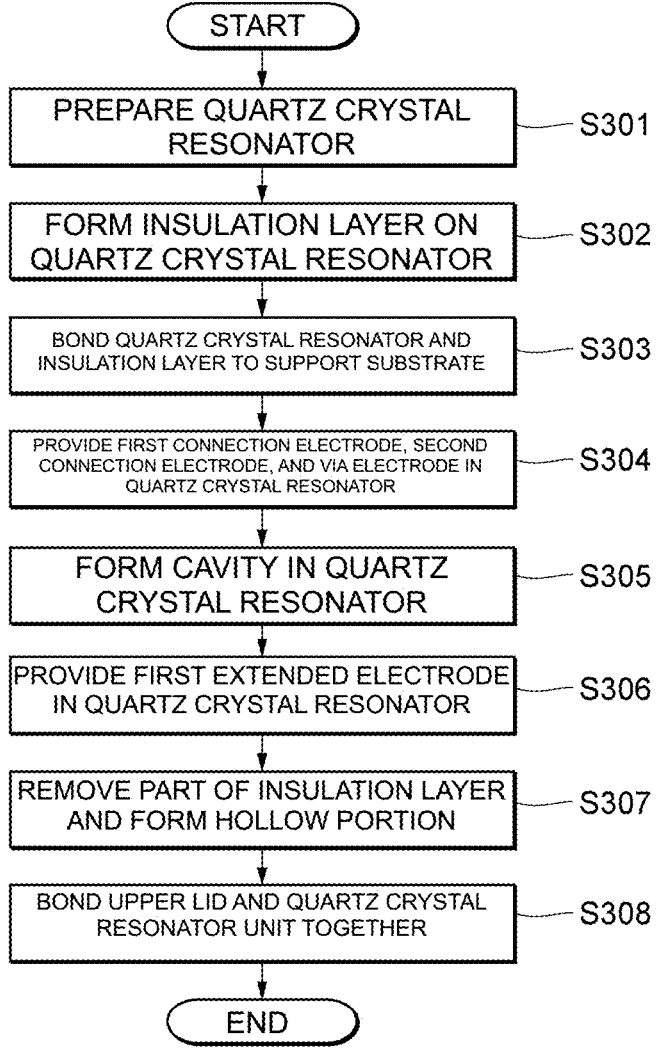

S300

START

PREPARE QUARTZ CRYSTAL RESONATOR — S301

FORM INSULATION LAYER ON QUARTZ CRYSTAL RESONATOR — S302

BOND QUARTZ CRYSTAL RESONATOR AND INSULATION LAYER TO SUPPORT SUBSTRATE — S303

PROVIDE FIRST CONNECTION ELECTRODE, SECOND CONNECTION ELECTRODE, AND VIA ELECTRODE IN QUARTZ CRYSTAL RESONATOR — S304

FORM CAVITY IN QUARTZ CRYSTAL RESONATOR — S305

PROVIDE FIRST EXTENDED ELECTRODE IN QUARTZ CRYSTAL RESONATOR — S306

REMOVE PART OF INSULATION LAYER AND FORM HOLLOW PORTION — S307

BOND UPPER LID AND QUARTZ CRYSTAL RESONATOR UNIT TOGETHER — S308

END

PIEZOELECTRIC VIBRATOR, PIEZOELECTRIC OSCILLATOR, AND PIEZOELECTRIC VIBRATOR MANUFACTURING METHOD HAVING ELECTRODES WITH DIFFERENT THICKNESSES

CROSS REFERENCE TO RELATED APPLICATIONS

The present application is a continuation of International application No. PCT/JP2021/025550, filed Jul. 7, 2021, which claims priority to Japanese Patent Application No. 2020-205988, filed Dec. 11, 2020, the entire contents of each of which are incorporated herein by reference.

FIELD OF THE INVENTION

The present invention relates to a piezoelectric vibrator, a piezoelectric oscillator, and a piezoelectric vibrator manufacturing method.

BACKGROUND OF THE INVENTION

Vibrators are used for a variety of applications, such as a timing device, a sensor, and an oscillator, in various types of electronic equipment, such as a mobile communication terminal, a communication base station, and a home electric appliance. Along with sophistication of electronic equipment, there is a need for a small-sized vibrator.

For example, Patent Document 1 discloses a method that forms a sacrificial layer at a place on a silicon substrate where an air gap is to be formed, provides a structural layer on the sacrificial layer and etches the structural layer into a required shape, removes the sacrificial layer by vapor-phase etching, and obtains a cantilever.

Patent Document 1: Japanese Unexamined Patent Application Publication No. 5-275401

SUMMARY OF THE INVENTION

If a sacrificial layer formed in advance is removed in a later process, as in the method disclosed in Patent Document 1, a structural layer is put into a so-called cantilevered state. For this reason, the structural layer may adhere to a substrate, that is, a so-called sticking problem may occur.

To cope with the above-described problem, the method disclosed in Patent Document 1 reduces a risk of sticking by vapor-phase etching in gas containing hydrogen fluoride gas and a tiny amount of vapor.

The method disclosed in Patent Document 1, however, have material and process constraints. For example, silicon oxide ($SiO_2$) cannot be used for a sacrificial layer if a material for a structural layer is a monocrystal of crystal, and removal of the sacrificial layer is limited to vapor-phase etching using gas in predetermined proportions. For this reason, application to a piezoelectric vibrator is limited, and sticking that refers to adhesion of a vibration portion to a substrate may occur in a piezoelectric vibrator.

The present invention has been made in view of the above-described circumstances, and has as one object to provide a piezoelectric vibrator, a piezoelectric oscillator, and a piezoelectric vibrator manufacturing method capable of inhibiting sticking of a vibration portion.

A piezoelectric vibrator according to one aspect of the present invention includes: a piezoelectric vibration element including: a piezoelectric blank having a first principal surface, a second principal surface opposing the first principal surface, and a vibration portion; a first excitation electrode on the first principal surface and within at least a part of the vibration portion of the piezoelectric blank; a second excitation electrode on the second principal surface and within at least a part of the vibration portion of the piezoelectric blank; a first extended electrode on the first principal surface of the piezoelectric blank and electrically connected to the first excitation electrode; and a second extended electrode on the second principal surface of the piezoelectric blank and electrically connected to the second excitation electrode; and an insulation layer including a hollow portion which defines a space with the second excitation electrode. A thickness of the first extended electrode is larger than a thickness of the second extended electrode. An end portion of the first extended electrode extends over the hollow portion in a plan view of the piezoelectric vibrator.

A piezoelectric oscillator according to another aspect of the present invention includes the above-described piezoelectric vibrator and a lid body.

A method of manufacturing a piezoelectric vibrator according to another aspect of the present invention includes: preparing a piezoelectric vibration element that includes: a piezoelectric blank having a first principal surface, a second principal surface opposing the first principal surface, and a vibration portion; a first excitation electrode on the first principal surface and within at least a part of the vibration portion of the piezoelectric blank; a second excitation electrode on the second principal surface and within at least a part of the vibration portion of the piezoelectric blank; and a second extended electrode on the second principal surface of the piezoelectric blank and electrically connected to the second excitation electrode; forming an insulation layer so as to cover the second excitation electrode and the second extended electrode; providing a first extended electrode on the first principal surface of the piezoelectric blank and which is electrically connected to the first excitation electrode; and removing a part of the insulation layer so as to form a hollow portion that defines a space with the second excitation electrode. A thickness of the first extended electrode is larger than a thickness of the second extended electrode. An end portion of the first extended electrode extends over the hollow portion in a plan view of the piezoelectric vibrator.

According to the present invention, it is possible to inhibit sticking of a vibration portion.

BRIEF DESCRIPTION OF DRAWINGS

FIG. 1 is a sectional view schematically showing a configuration of a crystal oscillator according to one embodiment.

FIG. 12 is a flowchart showing a method for manufacturing the quartz crystal resonator unit according to the one embodiment.

DETAILED DESCRIPTION OF THE PREFERRED EMBODIMENTS

Figure 2:
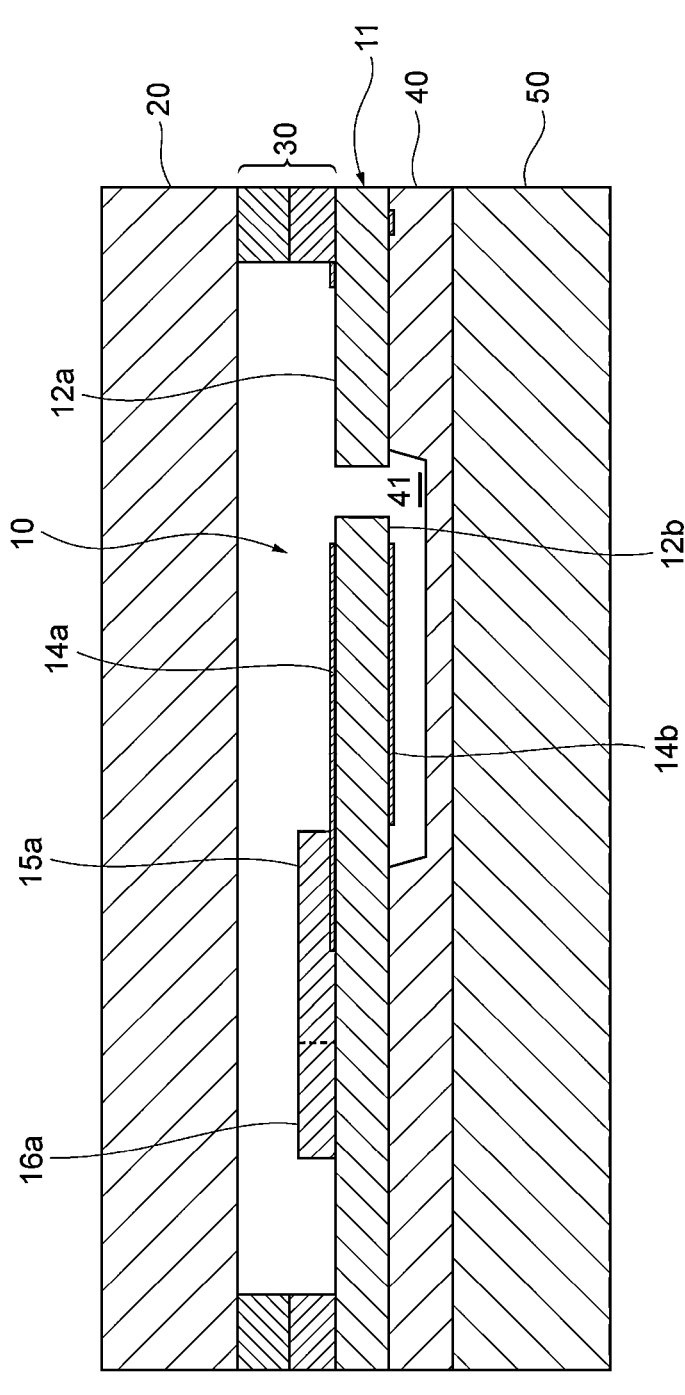
FIG. 2 is a sectional view schematically showing a configuration of a quartz crystal resonator unit according to the one embodiment.
Figure 2:
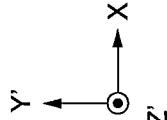

An embodiment of the present invention will be described below. In the following description of the drawings, identical or similar constituent elements are denoted by identical or similar reference characters. The drawings are illustrative only, dimensions and shapes of portions are schematic, and the technical scope of the present invention should not be interpreted as being limited to the embodiment.

Embodiment

Each drawing may be provided with a Cartesian coordinate system consisting of an X axis, a Y' axis, and a Z' axis for convenience to clarify mutual relationships between drawings and to help understanding of positional relationships between members. The X axis, the Y' axis, and the Z' axis correspond to one another in each drawing. The X axis, the Y' axis, and the Z' axis correspond to respective crystallographic axes of a quartz crystal blank 11 (to be described later). The X axis, a Y axis, and a Z axis correspond to an electric axis (polar axis) of crystal, a mechanical axis of crystal, and an optical axis of crystal, respectively. The Y' axis and the Z' axis are axes obtained by rotating the Y axis and the Z axis, respectively, around the X axis in a direction from the Y axis toward the Z axis by 35 degrees and 15 minutes±1 minute and 30 seconds.

Figure 1:
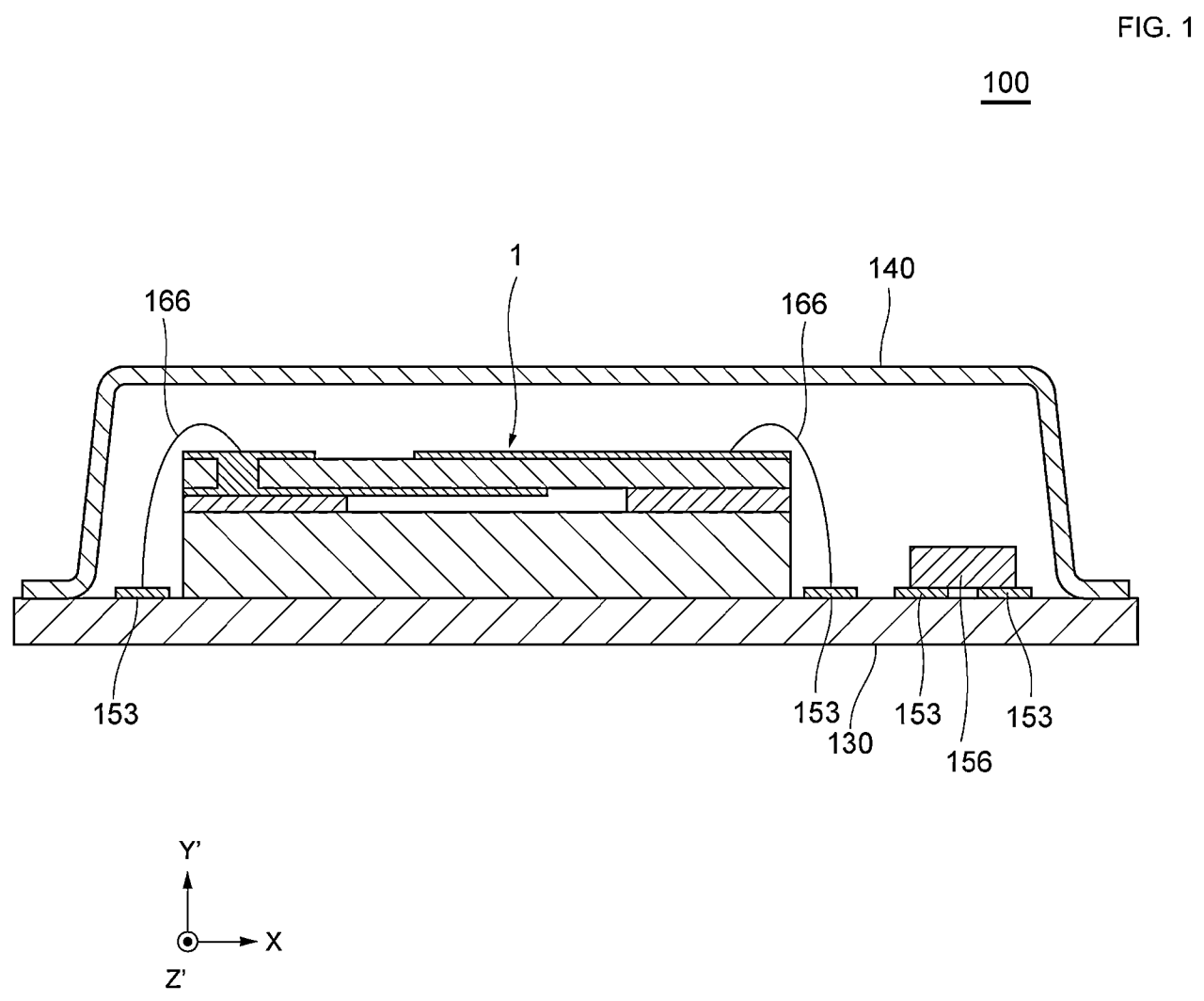

In the following description, a direction parallel to the X axis is referred to as an "X-axis direction", a direction parallel to the Y' axis is referred to as a "Y'-axis direction", and a direction parallel to the Z' axis is referred to as a "Z'-axis direction". A direction in which a tip of an arrow along each of the X axis, the Y' axis, and the Z' axis points is called "positive" or "+(plus)", and a direction opposite to the arrow is called "negative" or "– (minus)". Note that although a +Y'-axis direction and a –Y'-axis direction will be described as an upward direction and a downward direction, respectively, for convenience, vertical orientations of a quartz crystal resonator 10, a quartz crystal resonator unit 1, and a crystal oscillator 100 are not limited. A plane defined by the X axis and the Z' axis is referred to as a Z'-X plane, and the same applies to a plane defined by other axes. A schematic configuration of a crystal oscillator according to one embodiment will be described first with reference to FIG. 1. FIG. 1 is a sectional view schematically showing a configuration of the crystal oscillator 100 according to one embodiment.

In the following description, a crystal oscillator (XO) including a quartz crystal resonator unit will be described as an example of a piezoelectric oscillator. A quartz crystal resonator unit including a quartz crystal resonator will be described as an example of a piezoelectric vibrator. A quartz crystal resonator including a quartz crystal blank will be described as an example of a piezoelectric vibration element. A quartz crystal blank is a type of piezoelectric material (piezoelectric blank) which vibrates in accordance with an applied voltage. Note that a piezoelectric oscillator is not limited to a quartz crystal resonator unit and may be one which uses a different piezoelectric material, such as ceramic. Similarly, a piezoelectric vibrator is not limited to a quartz crystal resonator unit and may be one which uses a different piezoelectric material, such as ceramic. Similarly, a piezoelectric vibration element is not limited to a quartz crystal resonator and may be one which uses a different piezoelectric material, such as ceramic.

As shown in FIG. 1, the crystal oscillator 100 includes the quartz crystal resonator unit 1, a mounting board 130, a lid member 140, and an electronic component 156. Note that the mounting board 130 and the lid member 140 according to the present embodiment correspond to an example of a lid body.

The quartz crystal resonator unit 1 and the electronic component 156 are housed in a space formed between the mounting board 130 and the lid member 140. The space formed by the mounting board 130 and the lid member 140 is, for example, hermetically sealed. Note that the space may be hermetically sealed in a vacuum or hermetically sealed in a state of being filled with gas, such as inert gas.

The mounting board 130 is a circuit board shaped like a flat plate. The mounting board 130 is configured to include, for example, a glass epoxy board and a wiring layer formed in the glass epoxy board by patterning.

The quartz crystal resonator unit 1 is provided on one surface (an upper surface in FIG. 1) of the mounting board 130. More particularly, the quartz crystal resonator unit 1 is electrically connected to the wiring layer of the mounting board 130 by bonding wires 166. With solders 153, the quartz crystal resonator unit 1 and the wiring layer of the mounting board 130 are bonded together. With this configuration, the quartz crystal resonator unit 1 is sealed in the space formed between the mounting board 130 and the lid member 140.

The lid member 140 has a bottomed cavity which is open on one side (a lower side in FIG. 1). In other words, the lid member 140 includes a top wall portion shaped like a flat plate, a side wall portion which extends from an outer edge of the top wall portion toward the mounting board 130, and a flange portion which extends outward from a distal end of the side wall portion. The flange portion is bonded to the one surface (the upper surface in FIG. 1) of the mounting board 130. With this configuration, the quartz crystal resonator unit 1 bonded to the mounting board 130 is housed inside the lid member 140. The lid member 140 is made of a metal material and is formed by, for example, drawing a metal plate.

The electronic component 156 is provided on the one surface (the upper surface in FIG. 1) of the mounting board 130. More particularly, the wiring layer of the mounting board 130 and the electronic component 156 are bonded together with the solders 153. With this configuration, the electronic component 156 is mounted on the mounting board 130.

The electronic component 156 is electrically connected to the quartz crystal resonator unit 1 through the wiring layer of the mounting board 130. The electronic component 156 is configured to include, for example, a capacitor and an IC chip. The electronic component 156 is, for example, a part of an oscillation circuit which oscillates the quartz crystal resonator unit 1, a part of a temperature compensation circuit which compensates for temperature characteristics of the quartz crystal resonator unit 1, or the like. If the electronic component 156 includes a temperature compensation circuit, the crystal oscillator 100 may be called a temperature compensated crystal oscillator (TCXO).

Figure 3:
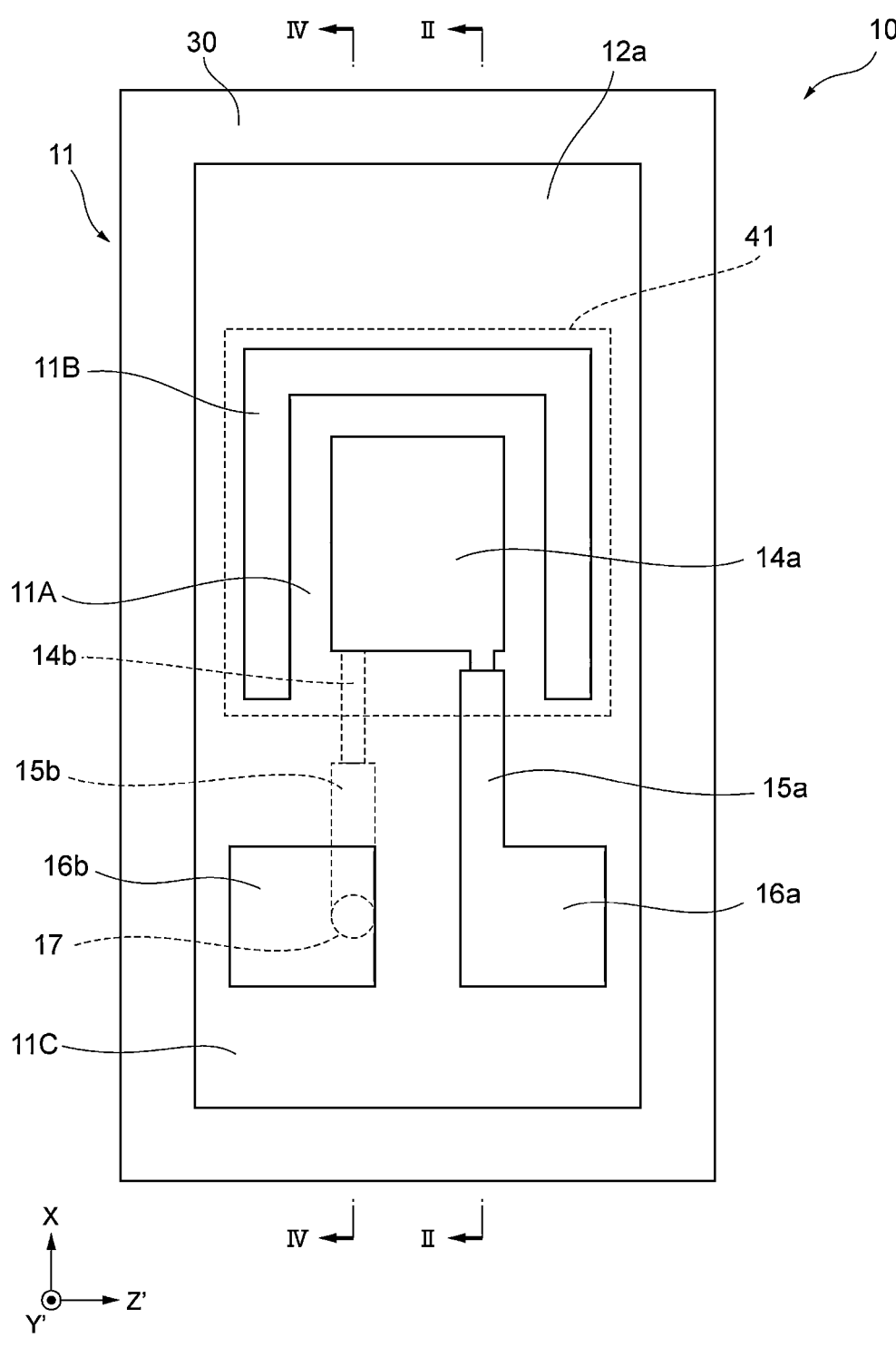
FIG. 3 is a plan view schematically showing a configuration of a quartz crystal resonator according to the one embodiment.
Figure 4:
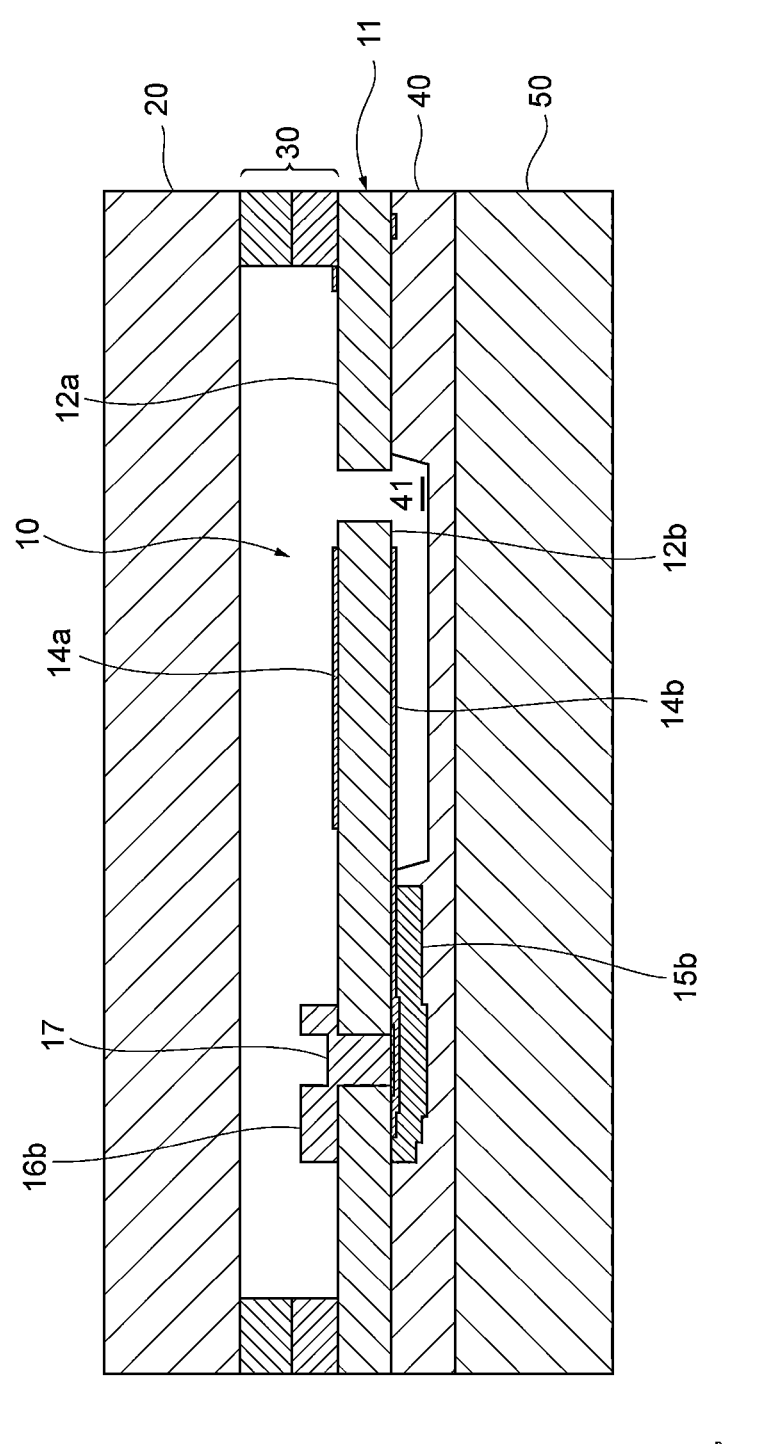
FIG. 4 is a sectional view schematically showing the configuration of the quartz crystal resonator unit according to the one embodiment.
Figure 4:
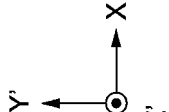

Next, a schematic configuration of a quartz crystal resonator unit according to the one embodiment will be described with reference to FIGS. 2 to 4. FIG. 2 is a sectional view schematically showing a configuration of the quartz crystal resonator unit 1 according to the one embodiment. FIG. 3 is a plan view schematically showing a configuration of the quartz crystal resonator 10 according to the one embodiment. FIG. 4 is a sectional view schematically showing the configuration of the quartz crystal resonator unit 1 according to the one embodiment. Note that FIG. 2 shows a section parallel to an X-Y' plane along line II-II shown in FIG. 3. FIG. 4 shows a section parallel to an X-Y' plane along line IV-IV shown in FIG. 3.

The quartz crystal resonator unit 1 includes the quartz crystal resonator 10, an upper lid 20, a bonding portion 30, an insulation layer 40, and a support substrate 50. Note that the upper lid 20 according to the present embodiment corresponds to an example of a lid member.

The quartz crystal resonator 10 is an element which causes crystal to vibrate due to the piezoelectric effect and makes a conversion between electric energy and mechanical energy. The quartz crystal resonator 10 includes the AT-cut quartz crystal blank 11. The AT-cut quartz crystal blank 11 is obtained by cutting a synthetic quartz crystal such that the AT-cut quartz crystal blank 11 has an X-Z' plane defined by an X axis and a Z' axis as a principal surface if a Y' axis and the Z' axis are axes obtained by rotating, of the X axis, a Y axis, and a Z axis which are crystallographic axes of the synthetic quartz crystal, the Y axis and the Z axis around the X axis in a direction from the Y axis toward the Z axis by 35 degrees and 15 minutes±1 minute and 30 seconds.

Note that rotation angles of the Y' axis and the Z' axis in the AT-cut quartz crystal blank 11 may deviate from 35 degrees and 15 minutes by an amount within the range of −5 degrees to +15 degrees inclusive. As cut-angles for the quartz crystal blank 11, different cuts than the AT cut, such as the BT cut, the GT cut, and the SC cut, may be used.

A quartz crystal resonator using an AT-cut quartz crystal blank has high frequency stability over a wide temperature range. The AT-cut quartz crystal resonator is also excellent in aging variation characteristics and can be manufactured at low cost. Additionally, the AT-cut quartz crystal resonator uses a thickness shear vibration mode as a principal vibration.

The quartz crystal resonator 10 includes one pair of excitation electrodes. An alternating electric field is applied between the one pair of excitation electrodes. With this configuration, a vibration portion 11A of the quartz crystal blank 11 vibrates at a predetermined oscillation frequency in the thickness shear vibration mode, and resonance characteristics associated with the vibration are obtained.

As described above, a principal vibration of the quartz crystal resonator 10 is the thickness shear vibration mode. For this reason, for example, use of the AT-cut quartz crystal blank 11 allows easy implementation of the quartz crystal resonator unit 1 that performs thickness shear vibration at a vibration frequency on the order of MHz.

The quartz crystal blank 11 has a first principal surface 12a and a second principal surface 12b which are X-Z' planes and face each other. The quartz crystal blank 11 has the shape of a flat plate. Thus, the first principal surface 12a and the second principal surface 12b of the quartz crystal blank 11 are flat surfaces. Note that the quartz crystal blank 11 is not limited to the shape of a flat plate, and a central portion may have, for example, a convex shape or a concave shape.

The AT-cut quartz crystal blank 11 has a long-side direction in which long sides parallel to the X-axis direction extend, a short-side direction in which short sides parallel to the Z'-axis direction extend, and a thickness direction in which a thickness parallel to the Y'-axis direction extends. The quartz crystal blank 11 has a rectangular shape when the first principal surface 12a of the quartz crystal blank 11 is viewed in plan view (hereinafter simply referred to as "plan view". A length in a direction parallel to the X-axis direction of the quartz crystal blank 11 is, for example, about 180 μm, and a length in a direction parallel to the Z'-axis direction of the quartz crystal blank 11 is, for example, about 180 μm. The thickness of the quartz crystal blank 11 is, for example, within the range of 0.5 μm to 3 μm inclusive and is, for example, about 1 μm. The quartz crystal blank 11 may be thinned to a predetermined thickness by, for example, being bonded to the support substrate 50 with the insulation layer 40 (to be described later) interposed therebetween in a state with a larger thickness and ground.

Note that a planar shape of the quartz crystal blank 11 is not limited to the rectangular shape. The planar shape of the quartz crystal blank 11 may be a polygonal shape, a circular shape, an elliptical shape, or a combination thereof.

The quartz crystal blank 11 includes the vibration portion 11A, a cavity 11B, and a holding portion 11C.

As described earlier, the vibration portion 11A of the quartz crystal blank 11 uses the thickness shear vibration mode as a principal vibration and vibrates at the predetermined oscillation frequency. A length in the direction parallel to the X-axis direction of the vibration portion 11A is, for example, about 80 μm, and a length in the direction parallel to the Z'-axis direction is, for example, about 80 μm.

The quartz crystal resonator 10 includes a first excitation electrode 14a and a second excitation electrode 14b which constitute the one pair of excitation electrodes. The first excitation electrode 14a and the second excitation electrode 14b are arranged on the vibration portion 11A of the quartz crystal blank 11. More particularly, the first excitation electrode 14a is provided at the first principal surface 12a of the vibration portion 11A, and the second excitation electrode 14b is provided at the second principal surface 12b of the vibration portion 11A. The first excitation electrode 14a and the second excitation electrode 14b are provided to face each other across the quartz crystal blank 11. The first excitation electrode 14a and the second excitation electrode 14b have respective rectangular shapes when the first principal surface 12a is viewed in plan view and are arranged so as to overlap substantially entirely with each other in an X-Z' plane. Respective lengths in the direction parallel to the X-axis direction of the first excitation electrode 14a and the second excitation electrode 14b are, for example, about 50 μm, and respective lengths in the direction parallel to the Z'-axis direction are, for example, about 50 μm.

Note that the first excitation electrode 14*a* and the second excitation electrode 14*b* are not limited to the respective rectangle shapes and may each have a polygonal shape, a circular shape, an elliptical shape, or a combination thereof.

The cavity 11B of the quartz crystal blank 11 is a cavity which is formed so as to surround the vibration portion 11A when the first principal surface 12*a* is viewed in plan view. The cavity extends in the thickness direction of the quartz crystal blank 11 parallel to the Z'-axis direction and communicates with a hollow portion 41 (to be described later). The cavity 11B is formed such that the vibration portion 11A and the holding portion 11C are spaced apart from each other by, for example, about 10 μm.

The holding portion 11C of the quartz crystal blank 11 holds one end portion (a lower end portion in FIG. 2) of the vibration portion 11A. The holding portion 11C is connected to an X-axis negative direction side in the vibration portion 11A.

The quartz crystal resonator 10 further includes a first extended electrode 15*a*, a second extended electrode 15*b*, a first connection electrode 16*a*, a second connection electrode 16*b*, and a via electrode 17. The first extended electrode 15*a*, the second extended electrode 15*b*, the first connection electrode 16*a*, the second connection electrode 16*b*, and the via electrode 17 are provided at the holding portion 11C of the quartz crystal blank 11.

The first extended electrode 15*a* is provided at the first principal surface 12*a* of the quartz crystal blank 11 and is electrically connected to the first excitation electrode 14*a*. In contrast, the second extended electrode 15*b* is provided at the second principal surface 12*b* of the quartz crystal blank 11 and is electrically connected to the second excitation electrode 14*b*. The second extended electrode 15*b* and the second connection electrode 16*b* are electrically connected by the via electrode 17 that extends in the thickness direction of the quartz crystal blank 11.

The first connection electrode 16*a* is electrically connected to the first excitation electrode 14*a* via the first extended electrode 15*a*. The second connection electrode 16*b* is electrically connected to the second excitation electrode 14*b* via the second extended electrode 15*b* and the via electrode 17. The first connection electrode 16*a* and the second connection electrode 16*b* are terminals for electrical connection to an outer electrode (not shown) which is provided at the upper lid 20. The first connection electrode 16*a* and the second connection electrode 16*b* are provided at the first principal surface 12*a* of the quartz crystal blank 11. Respective lengths in the direction parallel to the X-axis direction of the first connection electrode 16*a* and the second connection electrode 16*b* are, for example, about 15 μm, and respective lengths in the direction parallel to the Z'-axis direction are, for example, about 20 μm.

The via electrode 17 is provided to extend from the first principal surface 12*a* of the quartz crystal blank 11 to the second principal surface 12*b*. A material for the via electrode 17 is, for example, aluminum (Al), and a thickness of the via electrode 17 is, for example, 1.0 μm. Note that the material for the via electrode 17 may be, for example, copper (Cu). In this case, the thickness of the via electrode 17 is, for example, within the range of 0.5 μm to 3.0 μm inclusive.

As described above, the first excitation electrode 14*a* is provided at the first principal surface 12*a*, the second excitation electrode 14*b* is provided at the second principal surface 12*b*, and the second extended electrode 15*b* is electrically connected to the second excitation electrode

14*b*. With this configuration, for example, application of an alternating electric field to the first excitation electrode 14*a* and the second excitation electrode 14*b* via the first extended electrode 15*a*, the second extended electrode 15*b*, the first connection electrode 16*a*, the second connection electrode 16*b*, and the via electrode 17 allows portions where the first excitation electrode 14*a* and the second excitation electrode 14*b* are provided in the quartz crystal blank 11 to implement the vibration portion 11A that vibrates in a predetermined vibration mode.

Materials for the first excitation electrode 14*a*, the second excitation electrode 14*b*, the first extended electrode 15*a*, the second extended electrode 15*b*, the first connection electrode 16*a*, and the second connection electrode 16*b* are, for example, aluminum (Al), molybdenum (Mo), or gold (Au). In this case, thicknesses of the first excitation electrode 14*a* and the second excitation electrode 14*b* are, for example, within the range of 0.05 μm to 0.2 μm inclusive. Each of the aforementioned electrodes may be, for example, a multilayer body composed of a titanium (Ti) layer provided on the quartz crystal blank 11 side and a gold (Au) layer provided on a surface side. In this case, a thickness of the titanium layer is, for example, about 0.005 μm, and a thickness of the gold layer is, for example, about 0.05 μm.

The upper lid 20 is a member shaped like a flat plate. Dimensions of the upper lid 20 in plan view are identical or substantially identical to dimensions of the quartz crystal resonator 10 (the quartz crystal blank 11). A length in the direction parallel to the X-axis direction of the upper lid 20 is, for example, about 180 μm, and a length in the direction parallel to the Z'-axis direction of the upper lid 20 is, for example, about 180 μm. A thickness of the upper lid 20 is, for example, within the range of 100 μm to 200 μm inclusive.

A material for the upper lid 20 is, for example, crystal. This allows reduction in a stress resulting from a difference in coefficient of thermal expansion between the bonding portion 30 and the quartz crystal resonator 10.

Note that the upper lid 20 is not limited to the case of a crystal plate and may be, for example, a ceramic plate or a glass plate.

The upper lid 20 may have conductivity. In this case, the upper lid 20 is made of 42 Alloy that is an alloy containing iron (Fe) and nickel (Ni), Kovar that is an alloy containing iron (Fe), nickel (Ni), and cobalt (Co), or the like.

The bonding portion 30 bonds the quartz crystal resonator 10 and the upper lid 20 together. A space is formed by the upper lid 20 and the quartz crystal resonator 10 bonded together. The space forms a part of a vibration space for the vibration portion 11A. The bonding portion 30 is provided around an entire perimeter of each of the upper lid 20 and the quartz crystal resonator 10. Specifically, the bonding portion 30 is provided on a lower surface of the upper lid 20 and the first principal surface 12*a* of the quartz crystal blank 11. The bonding portion 30 has the shape of a frame when the first principal surface 12*a* is viewed in plan view. A width of the frame, that is, a difference between an outer periphery and an inner periphery is, for example, about 20 μm.

As described above, the provision of the bonding portion 30 that bonds the quartz crystal resonator 10 and the upper lid 20 together makes it possible to, for example, seal the quartz crystal resonator 10 between the upper lid 20 and the support substrate 50.

The bonding portion 30 has electrical insulation (nonconductivity). The bonding portion 30 is, for example, a glass adhesive which is made of inorganic glass and solidifies by heating treatment to exhibit an adhesive action. The inorganic glass is, for example, lead borate-based or tin phosphate-based low-melting glass.

If a material for the bonding portion 30 is a low-melting glass adhesive, the adhesive may contain lead-free vanadium-based (V-based) glass that melts at temperatures not less than 300° C. and not more than 410° C. The vanadium-based glass exhibits an adhesive action when a binder and a solvent in paste form are added to the vanadium-based glass, and the vanadium-based glass is melted and solidified. The vanadium-based glass may contain a different metal, such as silver (Ag).

The material for the bonding portion 30 may be, for example, a resin adhesive. The resin adhesive may contain thermosetting resin or photocurable resin, and an epoxy-based adhesive containing epoxy resin as a major ingredient, for example, can be used. A bifunctional epoxy resin, such as bisphenol A epoxy resin or bisphenol F epoxy resin, a novolac epoxy resin, such as phenol novolac epoxy resin or cresol novolac epoxy resin, or the like can be used as the epoxy resin. A generally known one, such as polyfunctional epoxy resin, glycidylamine epoxy resin, heterocycle-containing epoxy resin, or cycloaliphatic epoxy resin, can also be applied.

The insulation layer 40 includes the hollow portion 41 that is formed in a portion corresponding to the vibration portion 11A of the quartz crystal resonator 10. The hollow portion 41 has a concave shape and forms a space with the second excitation electrode 14b provided at the second principal surface 12b of the quartz crystal blank 11.

The insulation layer 40 bonds the quartz crystal resonator 10 and the support substrate 50 together. More particularly, the insulation layer 40 is formed on a lower surface of the quartz crystal resonator 10 and bonds an upper surface of the support substrate 50 and the second principal surface 12b of the quartz crystal blank 11 together.

As described above, the insulation layer 40 bonds the quartz crystal resonator 10 and the support substrate 50 together, which makes it possible to, for example, seal the quartz crystal resonator 10 between the upper lid 20 and the support substrate 50.

A material for the insulation layer 40 is, for example, a silicon oxide film (silicon dioxide (SiO₂)). This allows reduction in a stress resulting from a difference in coefficient of thermal expansion from the quartz crystal resonator 10 and a stress resulting from a difference in coefficient of thermal expansion from the support substrate 50.

A thickness of the insulation layer 40 is desirably not less than 0.5 μm and is, for example, within the range of 1 μm to 1.5 μm inclusive. In this case, a thickness (depth) parallel to the Y'-axis direction of the hollow portion 41 is, for example, within the range of 0.2 μm to 0.5 μm inclusive.

A thickness of the bonding portion 30 described earlier is set larger than the thickness of the insulation layer 40. More particularly, the thickness of the bonding portion 30 is, for example, within the range of 2 μm to 90 μm inclusive. This makes it possible to make a thickness (depth) parallel to the Y'-axis direction of the space formed between the upper lid 20 and the quartz crystal resonator 10 by the bonding portion 30 larger than a thickness (depth) parallel to the Y'-axis direction of a space formed between the insulation layer 40 and the quartz crystal resonator 10 by the hollow portion 41. Thus, effects of a stress resulting from a difference in coefficient of thermal expansion between the bonding portion 30 and the quartz crystal resonator 10 on the vibration portion 11A can be mitigated.

Note that the material for the insulation layer 40 is not limited to a silicon oxide film and may be a silicon nitride film (silicon nitride (Si₃N₄)) or various type of adhesive.

The support substrate 50 is configured to support the quartz crystal resonator 10 and the insulation layer 40. With this configuration, the vibration portion 11A of the quartz crystal resonator 10 can be supported to be capable of vibration.

The support substrate 50 is, for example, a substrate shaped like a flat plate. Dimensions of the support substrate 50 in plan view are identical or substantially identical to the dimensions of the quartz crystal resonator 10 (the quartz crystal blank 11). A length in the direction parallel to the X-axis direction of the support substrate 50 is, for example, about 180 μm, and a length in the direction parallel to the Z'-axis direction of the support substrate 50 is, for example, about 180 μm. A thickness of the support substrate 50 is, for example, within the range of 50 μm to 500 μm inclusive.

A material for the support substrate 50 is, for example, crystal. This allows reduction in a stress resulting from a difference in coefficient of thermal expansion between the quartz crystal resonator 10 and the insulation layer 40.

Note that the support substrate 50 is not limited to the case of a crystal substrate and may be, for example, a silicon substrate.

A thickness of the first extended electrode 15a is set larger than a thickness of the second extended electrode 15b. More particularly, the thickness of the first extended electrode 15a is, for example, about 1 μm, and the thickness of the second extended electrode 15b is, for example, within the range of 0.5 or more to less than 1 μm. Here, stresses generated in the first extended electrode 15a and the second extended electrode 15b are proportional to the respective thicknesses. Thus, the stress of the second extended electrode 15b is higher than the stress of the first extended electrode 15a.

As shown in FIG. 3, an end portion (an upper end portion in FIG. 3) of the first extended electrode 15a extends beyond an end portion of the hollow portion 41 present below the vibration portion 11A and is electrically connected to the first excitation electrode 14a. In other words, the end portion of the first extended electrode 15a is arranged on one side including the vibration portion 11A with respect to the end portion of the hollow portion 41 (an X-axis positive direction side in FIG. 3) in plan view. This makes it possible to cause a stress of the first extended electrode 15a higher than a stress of the second extended electrode 15b to act in a direction of pulling up the vibration portion 11A. Thus, the vibration portion 11A is pulled toward the first extended electrode 15a, and sticking that refers to adhesion of the vibration portion 11A to the insulation layer 40 can be inhibited.

In contrast, an end portion (an upper end portion in FIG. 3) of the second extended electrode 15b does not extend to the end portion of the hollow portion 51 present below the vibration portion 11A and is electrically connected to the second excitation electrode 14b on the near side of the end portion of the hollow portion 41. In other words, the end portion of the second extended electrode 15b is arranged on the other side with respect to the end portion of the hollow portion 41 (an X-axis negative direction side in FIG. 3) in plan view. For this reason, the arrangement of the end portion of the second extended electrode 15b outside the vibration portion 11A allows reduction in effects of a stress of the second extended electrode 15b which can act in a direction of pulling down the vibration portion 11A.

The cavity 11B is arranged on the one side including the vibration portion 11A with respect to the end portion of the hollow portion 41 (inside the hollow portion 41 in FIG. 3) in plan view. For this reason, the arrangement of the cavity 11B inside the vibration portion 11A allows mitigation of effects of a stress resulting from a difference in coefficient of thermal expansion between the insulation layer 40 and the quartz crystal resonator 10 on the vibration portion 11A. Thus, characteristics, such as a vibration frequency and a Q-factor, in the quartz crystal resonator 10 can be stabilized.

Additionally, the bonding portion 30 is arranged on the other side with respect to the end portion of the hollow portion 41 (outside the hollow portion 41 in FIG. 3) in plan view. For this reason, the arrangement of the bonding portion 30 outside the vibration portion 11A allows mitigation of effects of a stress resulting from a difference in coefficient of thermal expansion between the bonding portion 30 and the quartz crystal resonator 10 on the vibration portion 11A. Thus, the characteristics, such as the vibration frequency and the Q-factor, in the quartz crystal resonator 10 can be stabilized.

Next, modifications of the embodiment described earlier will be described. Note that identical or similar components to the components illustrated in FIGS. 1 to 4 are denoted by identical or similar reference characters and that a description thereof will be appropriately omitted. Same operational effects of same configurations will not be mentioned.

Modifications

Figure 5:
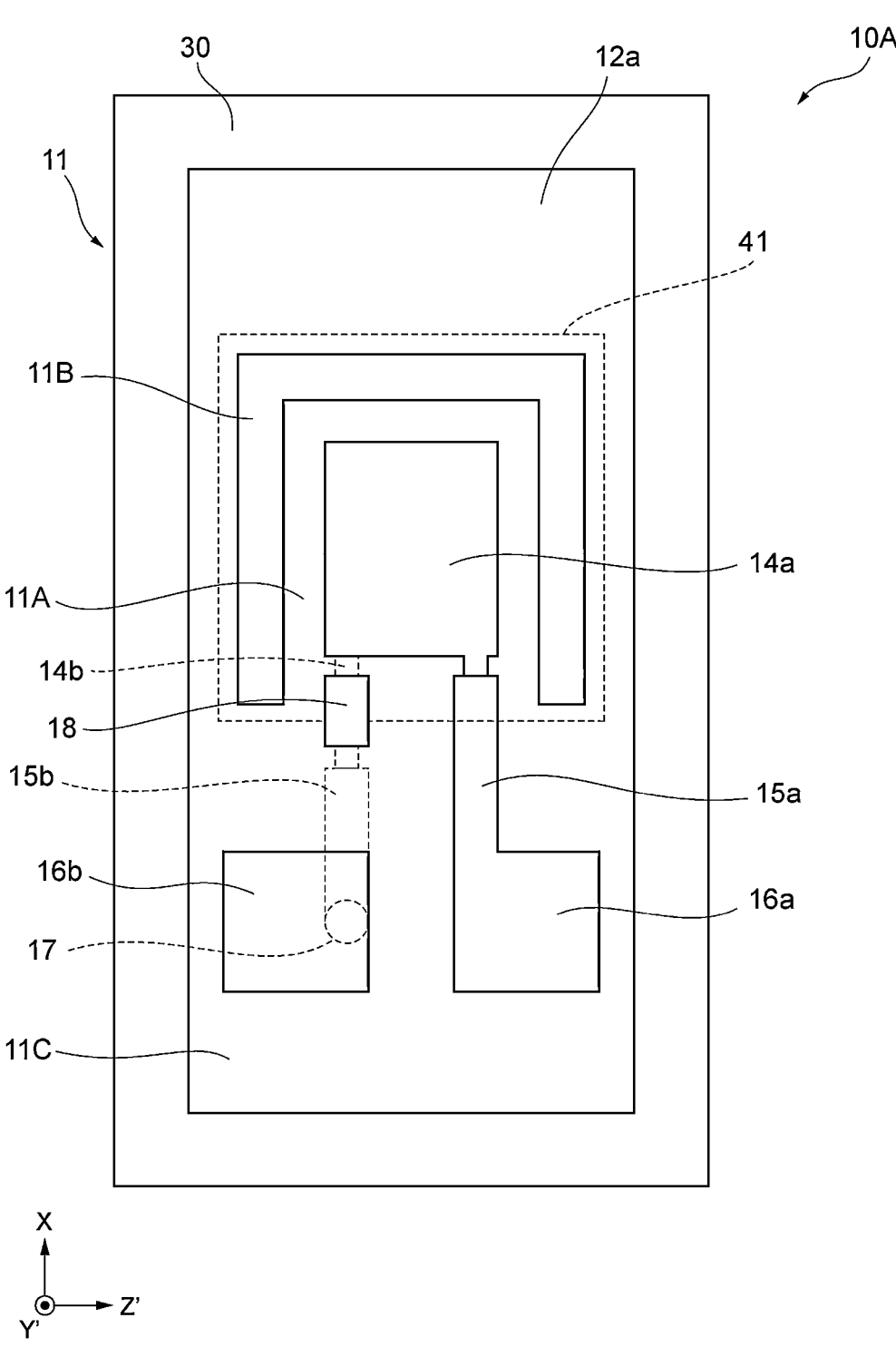
FIG. 5 is a plan view schematically showing a configuration of a quartz crystal resonator according to a first modification of the one embodiment.
Figure 6:
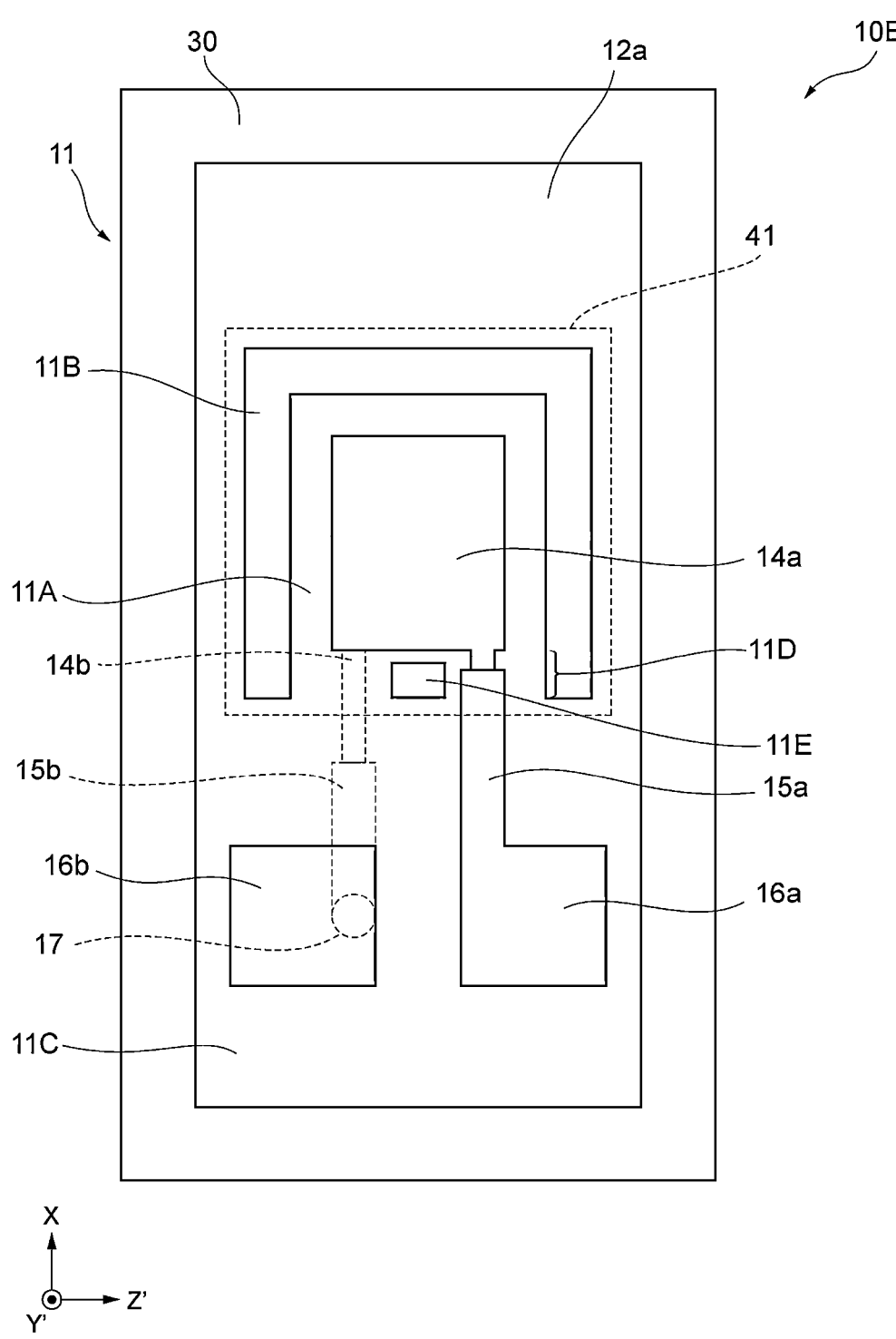
FIG. 6 is a plan view schematically showing a configuration of a quartz crystal resonator according to a second modification of the one embodiment.
Figure 7:
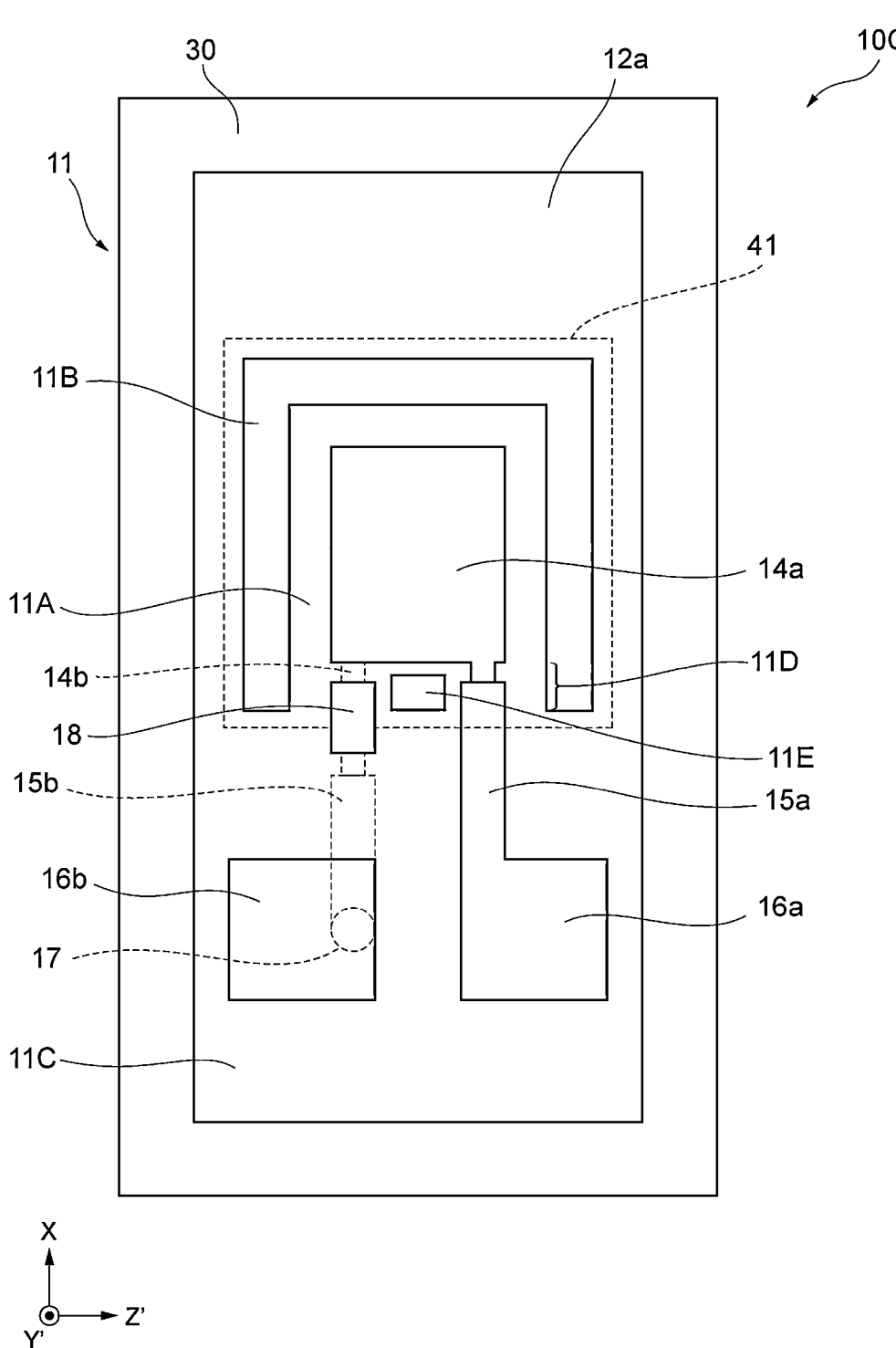
FIG. 7 is a plan view schematically showing a configuration of a quartz crystal resonator according to a third modification of the one embodiment.
Figure 8:
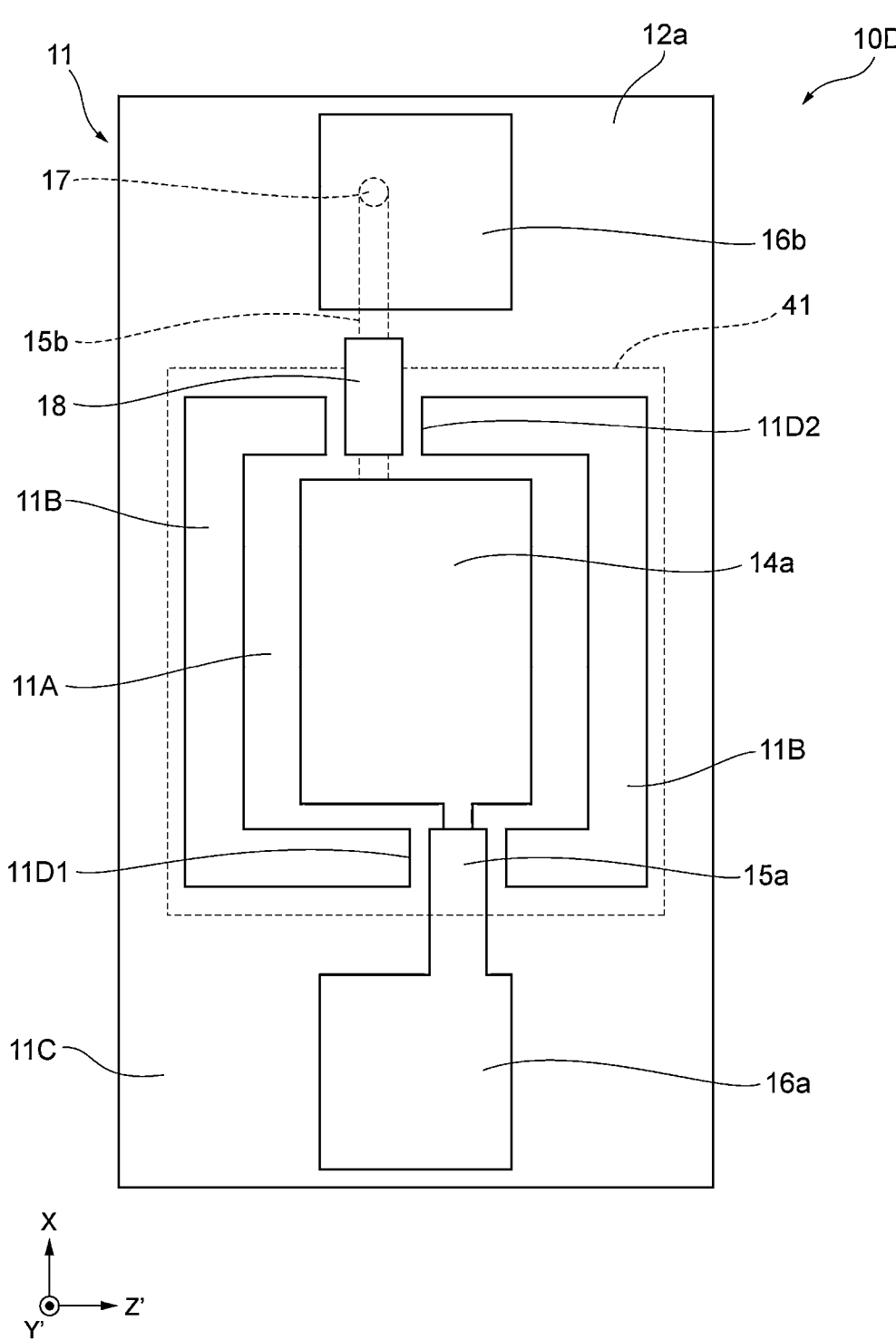
FIG. 8 is a plan view schematically showing a configuration of a quartz crystal resonator according to a fourth modification of the one embodiment.
Figure 9:
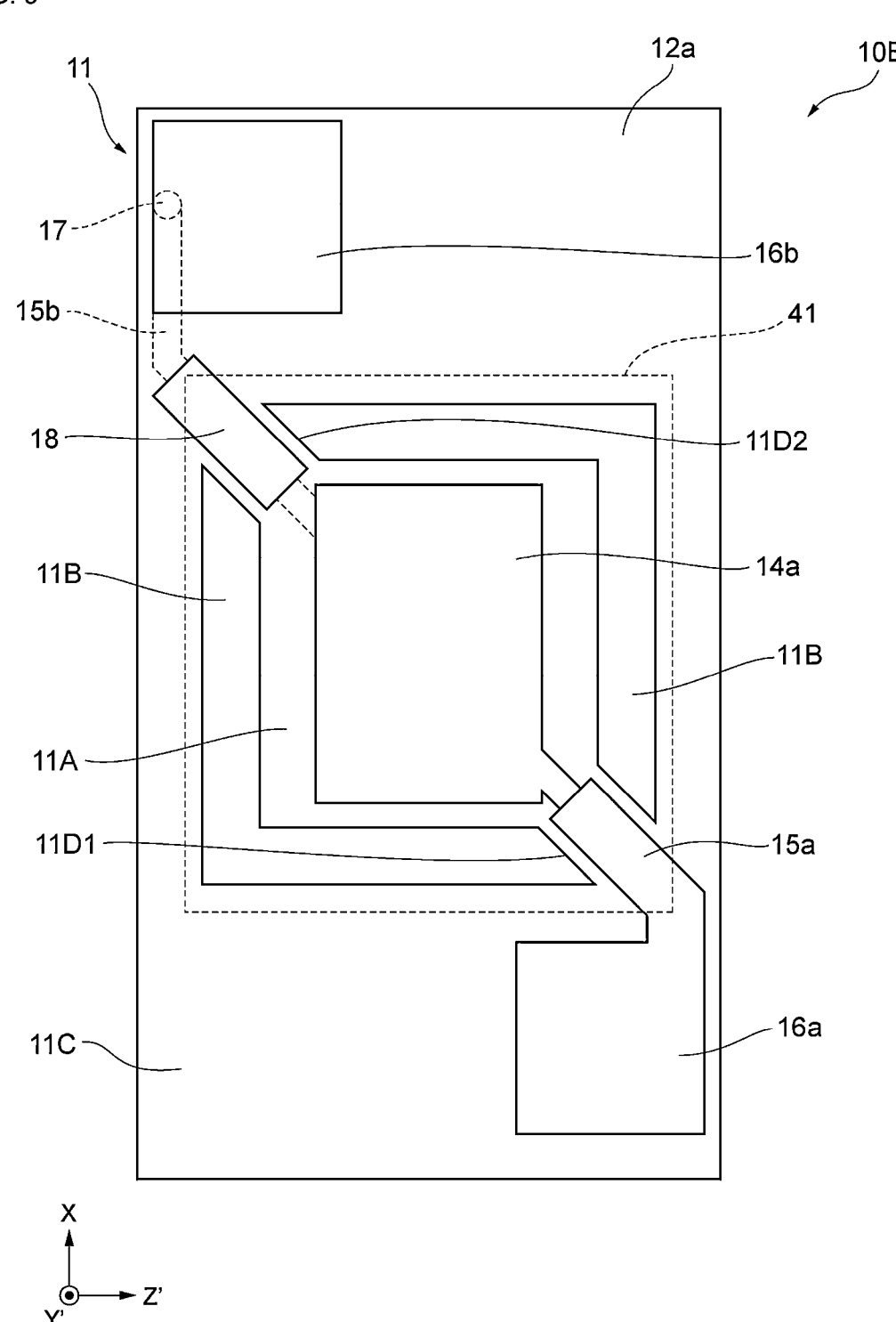
FIG. 9 is a plan view schematically showing a configuration of a quartz crystal resonator according to a fifth modification of the one embodiment.
Figure 10:
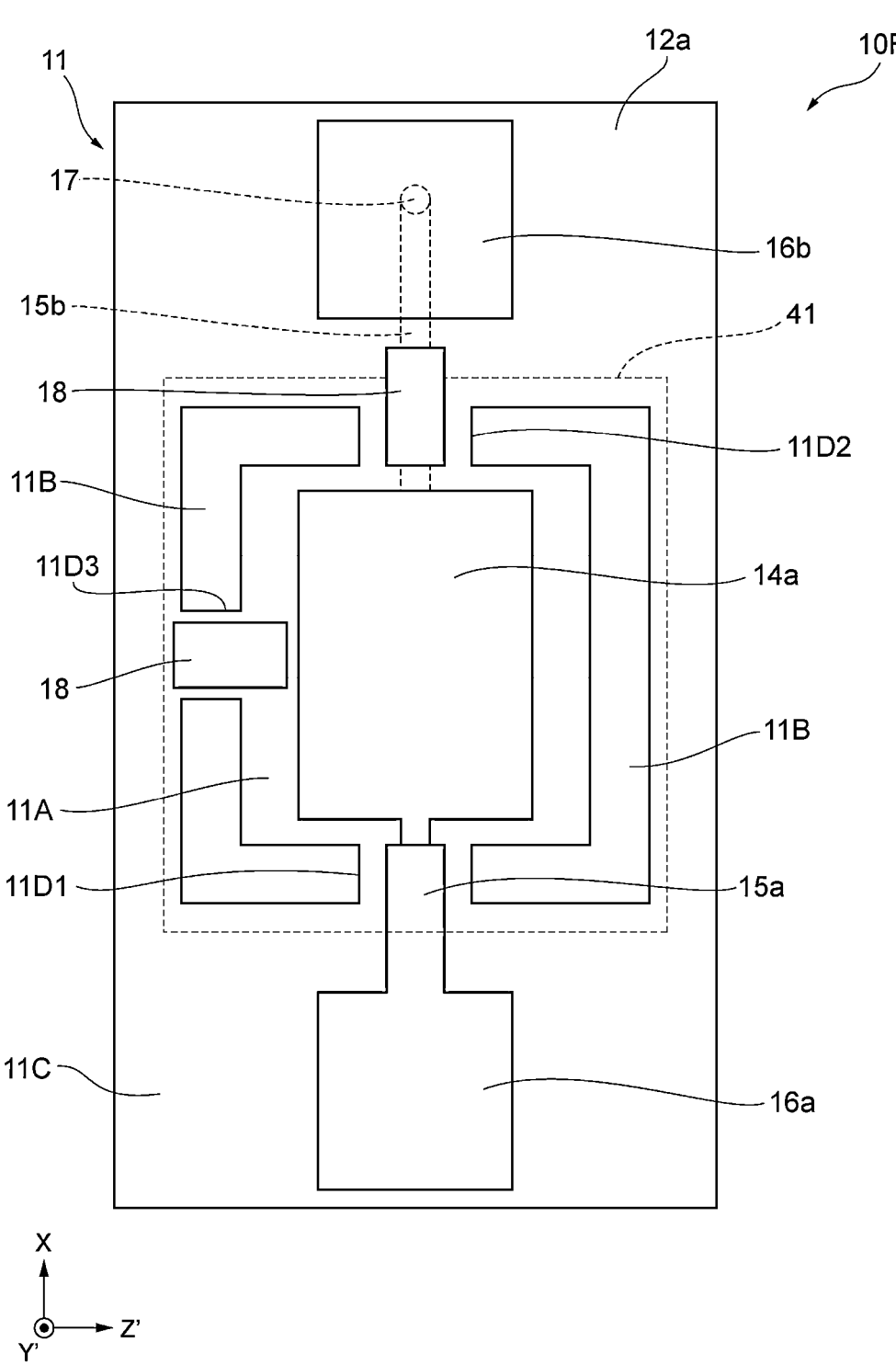
FIG. 10 is a plan view schematically showing a configuration of a quartz crystal resonator according to a sixth modification of the one embodiment.
Figure 11:
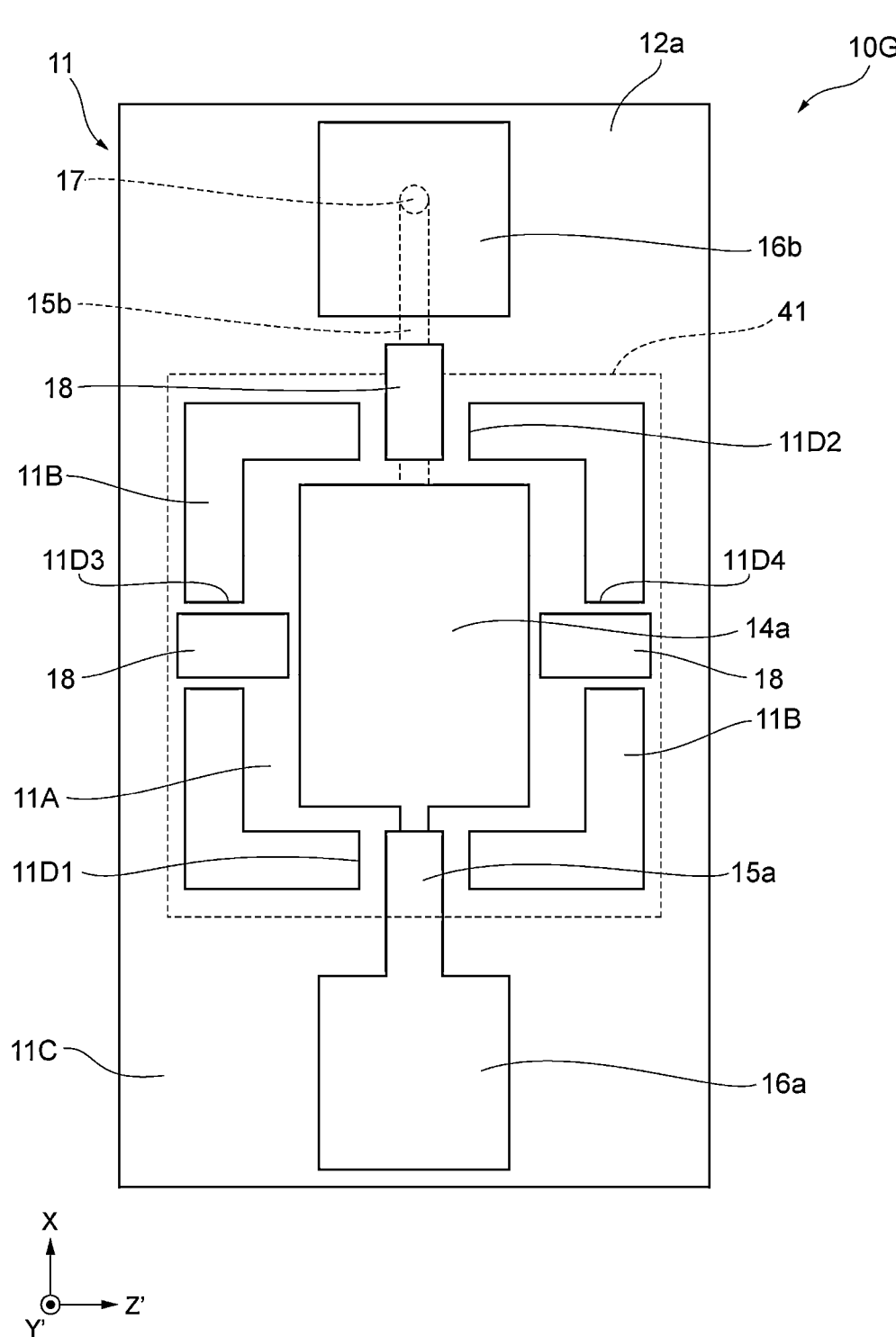
FIG. 11 is a plan view schematically showing a configuration of a quartz crystal resonator according to a seventh modification of the one embodiment.

FIG. 5 is a plan view schematically showing a configuration of a quartz crystal resonator 10A according to a first modification of the one embodiment. FIG. 6 is a plan view schematically showing a configuration of a quartz crystal resonator 10B according to a second modification of the one embodiment. FIG. 7 is a plan view schematically showing a configuration of a quartz crystal resonator 10C according to a third modification of the one embodiment. FIG. 8 is a plan view schematically showing a configuration of a quartz crystal resonator 10D according to a fourth modification of the one embodiment. FIG. 9 is a plan view schematically showing a configuration of a quartz crystal resonator 10E according to a fifth modification of the one embodiment. FIG. 10 is a plan view schematically showing a configuration of a quartz crystal resonator 10F according to a sixth modification of the one embodiment. FIG. 11 is a plan view schematically showing a configuration of a quartz crystal resonator 10G according to a seventh modification of the one embodiment.

As shown in FIG. 5, the quartz crystal resonator 10A further includes a conductor 18 having conductivity. The conductor 18 is provided at the first principal surface 12*a* and is arranged between the first excitation electrode 14*a* and the second connection electrode 16*b* in plan view. In other words, the conductor 18 is not electrically connected to the first excitation electrode 14*a* and the second connection electrode 16*b*.

A thickness of the conductor 18 is set larger than a thickness of the second extended electrode 15*b*. More particularly, the thickness of the conductor 18 is, for example, about 1 μm. An end portion (an upper end portion in FIG. 5) of the conductor 18 is arranged on one side including the vibration portion 11A (an X-axis positive direction side in FIG. 5) with respect to an end portion of the hollow portion 41. This allows a stress of the conductor 18 higher than a stress of the second extended electrode 15*b* to act in a direction of further pulling up the vibration portion 11A.

As shown in FIG. 6, the quartz crystal blank 11 of the quartz crystal resonator 10B includes a coupling portion 11D and a slit 11E. The coupling portion 11D couples the vibration portion 11A and the holding portion 11C together. More specifically, the coupling portion 11D couples the vibration portion 11A and the holding portion 11C on one side with respect to the vibration portion 11A (a lower side in FIG. 6) together.

The slit 11E is formed in the coupling portion 11D. That is, the slit 11E is a hole which is formed between the vibration portion 11A and the holding portion 11C that holds one end (a lower end in FIG. 6) of the vibration portion 11A. The hole extends in a thickness direction of the quartz crystal blank 11 and communicates with the hollow portion 41. This allows reduction in vibration leakage from the vibration portion 11A to the holding portion 11C.

As shown in FIG. 7, in the quartz crystal resonator 10C, the quartz crystal blank 11 includes a coupling portion 11D and a slit 11E, as in the quartz crystal resonator 10B shown in FIG. 6. Additionally, the quartz crystal resonator 10C may include a conductor 18, like the quartz crystal resonator 10A shown in FIG. 5.

Note that although FIGS. 3 and 5 to 7 show examples of a so-called cantilever structure in which the holding portion 11C holds the vibration portion 11A at one point, the present invention is not limited to this.

As in the quartz crystal resonator 10D shown in FIG. 8, the quartz crystal blank 11 may include two coupling portions 11D1 and 11D2. The coupling portion 11D1 couples the vibration portion 11A and the holding portion 11C on one side with respect to the vibration portion 11A (a lower side in FIG. 8) together in plan view. The coupling portion 11D2 couples the vibration portion 11A and the holding portion 11C on the other side with respect to the vibration portion 11A (an upper side in FIG. 8) together in plan view.

The first extended electrode 15*a* is provided at the coupling portion 11D and the holding portion 11C that are on the one side with respect to the vibration portion 11A (the lower side in FIG. 8) at the first principal surface 12*a*. In contrast, the second extended electrode 15*b* is provided at the holding portion 11C on the other side with respect to the vibration portion 11A (the upper side in FIG. 8) at the second principal surface 12*b*.

The first connection electrode 16*a* is provided at the holding portion 11C on the one side with respect to the vibration portion 11A (the lower side in FIG. 8) at the first principal surface 12*a*. In contrast, the second connection electrode 16*b* and the via electrode 17 are provided at the holding portion 11C on the other side with respect to the vibration portion 11A (the upper side in FIG. 8) at the first principal surface 12*a*.

The quartz crystal resonator 10D may include a conductor 18, like the quartz crystal resonator 10A shown in FIG. 5.

As shown in FIG. 9, the quartz crystal blank 11 of the quartz crystal resonator 10E includes two coupling portions 11D1 and 11D2, and the coupling portions 11D1 and 11D2 may each couple a corner portion of the vibration portion 11A and the holding portion 11C together.

Note that although FIGS. 8 and 9 show examples of a so-called both ends-supported structure in which the holding portion 11C holds the vibration portion 11A at two points, the present invention is not limited to this.

As in the quartz crystal resonator 10F shown in FIG. 10, the quartz crystal blank 11 may include three coupling portions 11D1, 11D2, and 11D3. In this case, the holding portion 11C holds the vibration portion 11A at three points via the coupling portions 11D1, 11D2, and 11D3.

As in the quartz crystal resonator 10G shown in FIG. 11, the quartz crystal blank 11 may include four coupling portions 11D1, 11D2, 11D3, and 11D4. In this case, the holding portion 11C holds the vibration portion 11A at four points via the coupling portions 11D1, 11D2, 11D3, and 11D4.

Note that, as shown in FIGS. 10 and 11, the quartz crystal resonator 10F and the quartz crystal resonator 10G may each further include one or a plurality of conductors 18.

Next, a quartz crystal resonator unit manufacturing method according to the one embodiment will be described with reference to FIG. 12. FIG. 12 is a flowchart showing a method for manufacturing the quartz crystal resonator unit 1 according to the one embodiment. Note that one quartz crystal resonator unit 1 of a plurality of quartz crystal resonator units to be manufactured by the manufacturing method will be described below for convenience. Assume that the quartz crystal resonator unit 1 includes the quartz crystal resonator 10 shown in FIGS. 2 to 4 unless expressly stated.

As shown in FIG. 12, the quartz crystal resonator 10 is prepared first (S301). Specifically, the quartz crystal resonator 10 including the quartz crystal blank 11, the first excitation electrode 14a and the second excitation electrode 14b arranged on the vibration portion 11A of the quartz crystal blank 11, and the second extended electrode 15b provided at the second principal surface 12b of the quartz crystal blank 11 is prepared. Note that the first connection electrode 16a, the second connection electrode 16b, and the first extended electrode 15a are not yet provided at the first principal surface 12a of the quartz crystal blank 11. The via electrode 17 extending in the thickness direction of the quartz crystal blank 11 is also not provided in the holding portion 11C of the quartz crystal blank 11. Additionally, the cavity 11B is not formed around the vibration portion 11A.

Next, the insulation layer 40 is formed on the quartz crystal resonator 10 prepared in step S301 (S302). Specifically, the insulation layer 40 is formed over substantially the whole of the second principal surface 12b of the quartz crystal blank 11 including the second connection electrode 16b and the second extended electrode 15b.

Next, the quartz crystal resonator 10 prepared in step S301 and the insulation layer 40 formed in step S302 are bonded to the support substrate 50 (S303).

Next, in the quartz crystal resonator 10 bonded to and supported by the support substrate 50 in step S303, the first connection electrode 16a, the second connection electrode 16b, and the via electrode 17 are provided (S304). The first connection electrode 16a, the second connection electrode 16b, and the via electrode 17 are provided in a region corresponding to the holding portion 11C at the first principal surface 12a of the quartz crystal blank 11. Specifically, the first connection electrode 16a and the second connection electrode 16b are obtained through patterning (formed) by, for example, vapor deposition, a lift-off method, or sputtering and etching. To form the via electrode 17, a hole which extends through the quartz crystal blank 11 is first formed at a predetermined position in the holding portion 11C of the quartz crystal blank 11 by wet etching or dry etching. The via electrode 17 is formed by filling the hole with a conductive material.

Next, in the quartz crystal resonator 10, in which the first connection electrode 16a, the second connection electrode 16b, and the via electrode 17 are provided in step S304, the cavity 11B is formed (S305). The cavity 11B is formed so as to surround at least a part of the vibration portion 11A, on which the first excitation electrode 14a and the second excitation electrode 14b are provided, in plan view. Specifically, the cavity 11B is formed by forming a cavity which extends through the quartz crystal blank 11 around the vibration portion 11A by wet etching or dry etching.

Next, in the quartz crystal resonator 10, in which the cavity 11B is formed in step S305, the first extended electrode 15a is provided (S306). The first extended electrode 15a is provided to extend from the holding portion 11C to the vibration portion 11A at the first principal surface 12a of the quartz crystal blank 11. Specifically, the first extended electrode 15a is each obtained through patterning (formed) by, for example, vapor deposition and a lift-off method or sputtering and etching.

Next, in the quartz crystal resonator 10, in which the first extended electrode 15a is provided in step S306, the hollow portion 41 is formed by removing a part of the insulation layer 40 (S307). The removal of the insulation layer 40 is performed via the cavity 11B formed in step S305. Specifically, a part of the insulation layer 40 is removed by performing etching or the like on the insulation layer 40 exposed by the cavity 11B of the quartz crystal blank 11. As a result, the concave hollow portion 41 is formed in the insulation layer 40.

Next, the quartz crystal resonator 10, in which the hollow portion 41 is formed in the insulation layer 40 in step S307, and the upper lid 20 are bonded together (S308). The bonding of the quartz crystal resonator 10 and the upper lid 20 is performed via the bonding portion 30. Specifically, the bonding portion 30 is formed on at least one of an outer peripheral portion in the first principal surface 12a of the quartz crystal blank 11 and an outer peripheral portion of a surface facing the quartz crystal resonator 10 in the upper lid 20. The quartz crystal resonator 10 and the upper lid 20 are bonded together by aligning the quartz crystal resonator 10 with the upper lid 20 and performing, for example, heating treatment and/or pressurization treatment.

The exemplary embodiment of the present invention has been described above. In a quartz crystal resonator unit according to one embodiment, a thickness of a first extended electrode is larger than a thickness of a second extended electrode. Here, stresses generated in the first extended electrode and the second extended electrode are proportional to the respective thicknesses. Thus, the stress of the first extended electrode is higher than the stress of the second extended electrode. An end portion of the first extended electrode is arranged on one side including a vibration portion with respect to an end portion of a hollow portion in plan view. This makes it possible to cause the stress of the first extended electrode higher than the stress of the second extended electrode to act in a direction of pulling up the vibration portion. Thus, the vibration portion is pulled toward the first extended electrode, and sticking that refers to adhesion of the vibration portion to an insulation layer can be inhibited.

In the quartz crystal resonator unit described earlier, an end portion of the second extended electrode is arranged on the other side with respect to the end portion of the hollow portion in plan view. For this reason, the arrangement of the end portion of the second extended electrode outside the vibration portion allows reduction in effects of a stress of the second extended electrode which can act in a direction of pulling down the vibration portion.

In the quartz crystal resonator unit described earlier, a thickness of a conductor is larger than the thickness of the second extended electrode, and an end portion of the conductor 18 is arranged on one side including the vibration portion with respect to the end portion of the hollow portion.

This allows a stress of the conductor higher than the stress of the second extended electrode to act in a direction of further pulling up the vibration portion.

In the quartz crystal resonator unit described earlier, a cavity is arranged on the one side including the vibration portion with respect to the end portion of the hollow portion in plan view. For this reason, the arrangement of the cavity inside the vibration portion allows mitigation of effects of a stress resulting from a difference in coefficient of thermal expansion between the insulation layer and a quartz crystal resonator on the vibration portion. Thus, characteristics, such as a vibration frequency and a Q-factor, in the quartz crystal resonator can be stabilized.

In the quartz crystal resonator unit described earlier, the quartz crystal resonator further includes a slit formed between the vibration portion and a holding portion which holds one end of the vibration portion. This allows reduction in vibration leakage from the vibration portion to the holding portion.

The quartz crystal resonator unit described earlier further includes a support substrate which supports the quartz crystal resonator and the insulation layer. With this configuration, the vibration portion of the quartz crystal resonator can be supported to be capable of vibration.

In the quartz crystal resonator unit described earlier, the insulation layer bonds the quartz crystal resonator and the support substrate together, and a material for the insulation layer is a silicon oxide film (silicon dioxide ($SiO_2$)). This allows reduction in a stress resulting from a difference in coefficient of thermal expansion from the quartz crystal resonator and a stress resulting from a difference in coefficient of thermal expansion from the support substrate.

In the quartz crystal resonator unit described earlier, a material for the support substrate is crystal. This allows reduction in a stress resulting from a difference in coefficient of thermal expansion between the quartz crystal resonator and the insulation layer.

In the quartz crystal resonator unit described earlier, a principal vibration of the quartz crystal resonator is the thickness shear vibration mode. For this reason, for example, use of an AT-cut quartz crystal blank allows easy implementation of a quartz crystal resonator unit which performs thickness shear vibration at a vibration frequency on the order of MHz.

In the quartz crystal resonator unit described earlier, a material for a piezoelectric blank is crystal. This allows easy implementation of a quartz crystal resonator unit which obtains, for example, frequency-temperature characteristics on the order of ppm.

The quartz crystal resonator unit described earlier further includes an upper lid and a bonding portion which bonds the quartz crystal resonator and the upper lid together. This makes it possible to, for example, seal the quartz crystal resonator 10 between the upper lid 20 and the support substrate 50.

In the quartz crystal resonator unit described earlier, the bonding portion is arranged on the other side with respect to the end portion of the hollow portion in plan view. For this reason, the arrangement of the bonding portion outside the vibration portion allows mitigation of effects of a stress resulting from a difference in coefficient of thermal expansion between the bonding portion and the quartz crystal resonator on the vibration portion. Thus, the characteristics, such as the vibration frequency and the Q-factor, in the quartz crystal resonator can be stabilized.

In the quartz crystal resonator unit described earlier, a thickness of the bonding portion is larger than a thickness of the insulation layer. This makes it possible to make a thickness (depth) parallel to the Y'-axis direction of a space formed between the upper lid and the quartz crystal resonator by the bonding portion larger than a thickness (depth) parallel to the Y'-axis direction of a space formed between the insulation layer and the quartz crystal resonator by the hollow portion. Thus, effects of a stress resulting from a difference in coefficient of thermal expansion between the bonding portion and the quartz crystal resonator on the vibration portion can be mitigated.

In the quartz crystal resonator unit described earlier, a material for the upper lid is, for example, crystal. This allows reduction in a stress resulting from a difference in coefficient of thermal expansion between the bonding portion and the quartz crystal resonator.

A crystal oscillator according to one embodiment includes the quartz crystal resonator unit described earlier and a lid member. This allows easy implementation of a crystal oscillator which inhibits sticking that refers to adhesion of a vibration portion to an insulation layer.

In a resonance device manufacturing method according to one embodiment, a thickness of a first extended electrode is larger than a thickness of a second extended electrode. Here, stresses generated in the first extended electrode and the second extended electrode are proportional to the respective thicknesses. Thus, the stress of the first extended electrode is higher than the stress of the second extended electrode. An end portion of the first extended electrode is arranged on one side including a vibration portion with respect to an end portion of a hollow portion in plan view. This makes it possible to cause the stress of the first extended electrode higher than the stress of the second extended electrode to act in a direction of pulling up the vibration portion. Thus, the vibration portion is pulled toward the first extended electrode, and sticking that refers to adhesion of the vibration portion to an insulation layer can be inhibited.

Note that the embodiment described above is intended to facilitate understanding of the present invention and is not intended to limitedly interpret the present invention. The present invention can be changed/improved without departing from the spirit thereof, and equivalents thereof are also included in the present invention. That is, ones obtained by appropriately making a design change to the embodiment and/or the modifications by those skilled in the art are also included in the scope of the present invention as long as the ones include features of the present invention. For example, elements included in the embodiment and/or the modifications and arrangement, materials, conditions, shapes, sizes, and the like thereof are not limited to the illustrated ones and can be appropriately changed. It is obvious that the embodiment and the modifications are illustrative and partial replacement or combination of components illustrated in different embodiments and/or modifications can be made. Such partial replacement or combination is included in the scope of the present invention as long as the partial replacement or combination includes features of the present invention.

REFERENCE SIGNS LIST 1 quartz crystal resonator unit
10, 10A, 10B, 10C, 10D, 10E, 10F, 10G quartz crystal resonator
11 quartz crystal blank
11A vibration portion
11B cavity
11C holding portion 11D, 11D1, 11D2, 11D3, 11D4 coupling portion
11E slit
12a first principal surface
12b second principal surface
14a first excitation electrode
14b second excitation electrode
15a first extended electrode
15b second extended electrode
16a first connection electrode
16b second connection electrode
17 via electrode
18 conductor
20 upper lid
30 bonding portion
40 insulation layer
41 hollow portion
50 support substrate
100 crystal oscillator
130 mounting board
140 lid member
153 solder
156 electronic component
166 bonding wire

The invention claimed is:

1. A piezoelectric vibrator comprising:
a piezoelectric vibration element including:
    a piezoelectric blank having a first principal surface, a
        second principal surface opposing the first principal
        surface, and a vibration portion;
    a first excitation electrode on the first principal surface
        and within at least a part of the vibration portion of
        the piezoelectric blank;
    a second excitation electrode on the second principal
        surface and within at least a part of the vibration
        portion of the piezoelectric blank;
    a first extended electrode on the first principal surface
        of the piezoelectric blank and electrically connected
        to the first excitation electrode; and
    a second extended electrode on the second principal
        surface of the piezoelectric blank and electrically
        connected to the second excitation electrode; and
an insulation layer including a hollow portion which
    defines a space with the second excitation electrode,
    wherein
a thickness of the first extended electrode is larger than a
    thickness of the second extended electrode, and
an end portion of the first extended electrode is arranged
    so as to extend over the hollow portion in a plan view
    of the piezoelectric vibrator.

2. The piezoelectric vibrator according to claim 1,
wherein an end portion of the second extended electrode
does not extend over the hollow portion in the plan view of
the piezoelectric vibrator.

3. The piezoelectric vibrator according to claim 1, further
comprising:
    a conductor on the first principal surface and not electri-
        cally connected to the first excitation electrode,
        wherein
    a thickness of the conductor is larger than the thickness of
        the second extended electrode, and
    an end portion of the conductor is arranged so as to extend
        over the hollow portion in the plan view of the piezo-
        electric vibrator.

4. The piezoelectric vibrator according to claim 1,
wherein
    the piezoelectric vibration element further includes a
        cavity that extends around the vibration portion and
        communicates with the space, and
    the cavity extends over the hollow portion in the plan
        view of the piezoelectric vibrator.

5. The piezoelectric vibrator according to claim 3,
wherein the piezoelectric vibration element further includes
a slit between the vibration portion and a holding portion
which holds an end of the vibration portion.

6. The piezoelectric vibrator according to claim 1,
wherein the piezoelectric vibration element further includes
a slit between the vibration portion and a holding portion
which holds an end of the vibration portion.

7. The piezoelectric vibrator according to claim 1, further
comprising:
    a support substrate which supports the piezoelectric vibra-
        tion element and the insulation layer.

8. The piezoelectric vibrator according to claim 7,
wherein
    the insulation layer bonds the piezoelectric vibration
        element and the support substrate together, and
    the insulation layer comprises silicon dioxide.

9. The piezoelectric vibrator according to claim 7,
wherein the support substrate comprises a crystal material.

10. The piezoelectric vibrator according to claim 1,
wherein a principal vibration of the piezoelectric vibration
element is a thickness shear vibration mode.

11. The piezoelectric vibrator according to claim 1,
wherein the piezoelectric blank comprises a crystal material.

12. The piezoelectric vibrator according to claim 1, fur-
ther comprising:
    a lid member; and
    a bonding portion which bonds the piezoelectric vibration
        element and the lid member together.

13. The piezoelectric vibrator according to claim 12,
wherein the bonding portion is arranged so as to not overlap
the hollow portion in the plan view of the piezoelectric
vibrator.

14. The piezoelectric vibrator according to claim 12,
wherein a thickness of the bonding portion is larger than a
thickness of the insulation layer.

15. A piezoelectric oscillator comprising:
    a mounting board;
    a lid member defining an internal space with the mounting
        board; and
    the piezoelectric vibrator according to claim 1 within the
        internal space between the mounting board and the lid
        member.

16. A method of manufacturing a piezoelectric vibrator,
the method comprising:
    preparing a piezoelectric vibration element that includes:
        a piezoelectric blank having a first principal surface, a
            second principal surface opposing the first principal
            surface, and a vibration portion; a first excitation elec-
            trode on the first principal surface and within at least a
            part of the vibration portion of the piezoelectric blank;
            a second excitation electrode on the second principal
            surface and within at least a part of the vibration portion
            of the piezoelectric blank; and a second extended
            electrode on the second principal surface of the piezo-
            electric blank and electrically connected to the second
            excitation electrode;
        forming an insulation layer so as to cover the second
            excitation electrode and the second extended electrode;

providing a first extended electrode on the first principal surface of the piezoelectric blank and which is electrically connected to the first excitation electrode; and removing a part of the insulation layer so as to form a hollow portion that defines a space with the second excitation electrode, wherein a thickness of the first extended electrode is larger than a thickness of the second extended electrode, and an end portion of the first extended electrode extends over the hollow portion in a plan view of the piezoelectric vibrator.

17. The method of manufacturing a piezoelectric vibrator according to claim 16, wherein an end portion of the second extended electrode does not extend over the hollow portion in the plan view of the piezoelectric vibrator.

18. The method of manufacturing a piezoelectric vibrator according to claim 16, the method further comprising:

forming a conductor on the first principal surface so as to not be electrically connected to the first excitation electrode, wherein a thickness of the conductor is larger than the thickness of the second extended electrode, and an end portion of the conductor is arranged so as to extend over the hollow portion in the plan view of the piezoelectric vibrator.

19. The method of manufacturing a piezoelectric vibrator according to claim 18, wherein the method further includes forming a slit between the vibration portion and a holding portion which holds an end of the vibration portion.

20. The method of manufacturing a piezoelectric vibrator according to claim 16, wherein the method further includes forming a slit between the vibration portion and a holding portion which holds an end of the vibration portion.

* * * * *